(12) United States Patent
Hsu

(10) Patent No.: US 6,858,498 B2
(45) Date of Patent: Feb. 22, 2005

(54) METHOD FOR MANUFACTURING MEMORY

(76) Inventor: Sung-Mu Hsu, No. 52, Rueilin Rd., Hsinchu City, 300 (TW)

( * ) Notice: Subject to any disclaimer, the term of this patent is extended or adjusted under 35 U.S.C. 154(b) by 0 days.

(21) Appl. No.: 10/648,286

(22) Filed: Aug. 27, 2003

(65) Prior Publication Data

US 2004/0266104 A1 Dec. 30, 2004

(30) Foreign Application Priority Data

Jun. 30, 2003 (TW) .......................................... 92117859 A

(51) Int. Cl.⁷ .......................................... H01L 21/8247
(52) U.S. Cl. ........................................ 438/267; 438/286
(58) Field of Search ................................ 438/258, 265, 438/266, 267, 286

(56) References Cited

U.S. PATENT DOCUMENTS

| 5,242,848 A | | 9/1993 | Yeh ............................ 438/266 |
| 6,174,772 B1 | * | 1/2001 | Hsieh et al. ................ 438/265 |
| 6,194,269 B1 | * | 2/2001 | Sung et al. .................. 438/266 |
| 6,200,859 B1 | * | 3/2001 | Huang et al. ................ 438/266 |
| 6,329,685 B1 | | 12/2001 | Lee ............................. 438/257 |
| 6,627,946 B2 | * | 9/2003 | Wang .......................... 438/267 |

* cited by examiner

Primary Examiner—Chandra Chaudhari
(74) Attorney, Agent, or Firm—Birch, Stewart, Kolasch & Birch, LLP

(57) ABSTRACT

A method for manufacturing a memory includes the following steps. An insulating layer, a polysilicon layer and a mask layer are formed on a substrate in sequence. Next, the mask layer is etched to expose portions of the polysilicon layer, and to define a first patterned region, a second patterned region and a third patterned region located between the first and second patterned regions. The exposed portions of the polysilicon layer are located in the first and second patterned regions. The portion of the polysilicon layer exposed in the second patterned region is then etched. An ion implanting process is performed to implant ions into the substrate so as to form a first doped region in the second patterned region. The substrate is oxidized to form a first silicon oxide region in the first patterned region. The mask layer is then removed, and the polysilicon layer is etched to form a gate with using the first silicon oxide region as a mask. Finally, an additional ion implanting process is performed to implant ions into the substrate so as to form a second doped region.

15 Claims, 12 Drawing Sheets

METHOD FOR MANUFACTURING MEMORY

This nonprovisional application claims priority under 35 U.S.C. § 119(a) on Patent Application No. 092117859 filed in Taiwan on Jun. 30, 2003, which is herein incorporated by reference.

FIELD OF INVENTION

The invention relates to a method for manufacturing memories, and in particular, to a method for manufacturing memories, in which the sources, drains, and gates of the memories are defined by self-alignment processes.

RELATED ART

In general, a conventional non-volatile memory cell includes a source, a drain, a control gate, and a floating gate. The memory cell typically performs in three operating modes, including a reading mode, a programming mode and an erasing mode, with electrons injected into or released from the floating gate. The floating gate traps the electrons, so that the data stored in the memory cell can be recorded as the entire memory is powered off. The floating gate and control gate consist of the gate of the memory cell, which are generally a split gate type, a stacked gate type, or a combination thereof.

A conventional memory device usually includes a memory array, which has a plurality of memory cells. A major obstacle to manufacturing the memory array has been the alignment of various components such as sources, drains, control gates, and floating gates. As the integration of semiconductor processes increases, which reduces the largest lithographic features, the need for precise alignment becomes more critical. Alignment of the various parts also determines the potential product yield.

Self-alignment is well known in the art. Self-alignment refers to the act of processing one or more steps involving one or more materials such that the features are automatically aligned with respect to one another in that step. Accordingly, the structure of the memory device can be accurately aligned to improve the production yield of the memory device. U.S. Pat. No. 5,242,848 discloses a self-aligned method of making a memory device, which is described herein below with reference to FIGS. 1A to 1J.

FIGS. 1A to 1C illustrate a first stage of manufacturing a conventional non-volatile memory to sequentially form a silicon oxide layer 20, a polysilicon layer 22 and a silicon nitride layer 70 on the substrate 10. The silicon nitride layer 70 is then patterned to expose a portion of the polysilicon layer 22. Specifically, the exposed polysilicon layer 22 defines the location of the floating gate, and the patterned silicon nitride layer 70 is used as a mask in subsequent processes.

FIGS. 1D to 1G show a second stage of manufacturing the conventional non-volatile memory. The exposed polysilicon layer 22 is oxidized to form a silicon oxide region 72 of a certain thickness; e.g., 2000 angstroms. The residual silicon nitride 70 is then etched away, leaving the oxide portion of the polysilicon layer 22 unchanged. Subsequently, an anisotropic silicon etching process; e.g., reactive ion etch, is applied to selectively etch the exposed polysilicon layer 22, which is not directly beneath the silicon oxide region 72. This leaves the final polysilicon layer 22, a floating gate 23, defined under the silicon oxide region 72. An oxidation process is performed to form an oxide layer 74 over the floating gate 23. A nitridization process is performed on the oxide layer 74 to form an oxynitride film, and an additional oxide layer is formed on the oxynitride film. This may result in a stacked insulating layer of an ONO structure (not shown) with an appropriate insulation property. As shown in FIG. 1F, the edge of the floating gate 23 is shaped as a sharp curved-up portion to form a charge injection region. With the sharp curved-up charge injection region, the tunneling probability of electrons is at the highest. In this case, oxidization processes and etching processes are required to form the silicon oxide region 72 resembling a bird's beak at the border of the silicon oxide region 72. Accordingly, the sharp curved-up charge injection region is obtained.

Finally, as shown in FIGS. 1H to 1J, in a third stage of manufacturing the conventional non-volatile memory, a second polysilicon layer 76 is deposited over the substrate 10. The second polysilicon layer 76 is then defined to form a control gate 29, which has a first portion 29a deposed over the floating gate 23, and a second portion 29b disposed over the oxide layer 74 and closely adjacent to the side wall of the floating gate 23. The second portion 29b acts as a select transistor closely adjacent to the floating gate 23. Ion (phosphorus or arsenic) implantation is then performed. The dosage is adjusted such that the N+ junction will diffuse and overlap underneath the floating gate or control gate in subsequent thermal steps. Accordingly, the source region 14 and drain region 16 are formed, and the memory cell is formed as shown in FIG. 1J. It should be noted that this ion implantation is self-aligned with the floating gate 23 and the control gate 29. In other words, the floating gate 23 and the control gate 29 are used as masks in this ion implantation.

In the manufacturing of the split gate non-volatile memory cell (as shown in FIG. 1J), the most critical point is the dimensions of the select transistor, which is defined between the floating gate 23 and the drain region 16. U.S. Pat. No. 5,242,848 discloses a method for defining the select transistor, and there are, however, some errors occurred when performing this method, such as:

1. In the first stage, a photolithography process is performed to pattern the silicon nitride layer 70 and to define the floating gate. In other words, an opening of the silicon nitride layer 70, which is predefined as the region of the floating gate, must be formed during the photolithography process. Thus, the width of the opening corresponds to the width of the floating gate, and there is, in practice, an error value $\Delta CD1$ according to the dimensions of the opening.

2. In the third stage, the second polysilicon layer 76 must be selectively etched to define the control gate 29, including the first portion 29a and second portion 29b, preceding the subsequent ion implantation. The floating gate 23 and the control gate 29 can then be used as a mask for self-aligned implanting ions to form the source region and drain region. In this case, there must be an additional error value $\Delta CD2$ corresponding to the dimensions error of the control gate 29.

3. In the process of defining the region of the control gate 29, misalignment occurs between the control gate 29 and the floating gate 23. In detail, when the photolithography process is performed to form the control gate 29, a misalignment error, with an error value $\Delta CD3$, between the control gate 29 and the floating gate 23 must be considered.

In brief, to manufacture the floating gate, control gate, source and drain of the conventional non-volatile memory cell, the above-mentioned error values, such as the $\Delta CD1$, $\Delta CD2$ and $\Delta CD3$, must be considered. Thus, a total error value $\Delta CDt$ can be obtained according to the following equation:

$$\Delta CDt=\{(\Delta CD1)^2+(\Delta CD2)^2+(\Delta CD3)^2\}^{0.5}$$

It should be noted that as the scale of integration of semiconductor processing increases, reducing the lithographic features, dimension control of various parts and the alignment errors there between profoundly affect yield of the manufacturing of the semiconductor memory cell. Thus, the need for precisely controlling the total error value $\Delta CDt$ becomes increasingly critical.

U.S. Pat. No. 6,329,685 discloses a self-aligned method of forming a memory array, which can control the mentioned total error value $\Delta CDt$ so as to improve the controllability of the dimension of the select transistor.

FIG. 2A shows a complicated stacked structure including a first polysilicon layer 32 (floating gate), an insulating layer 33, a second polysilicon layer 34 (source line), a first doped region 30 (source), a silicon oxide layer 31, a silicon oxide layer 36, and a silicon oxide 38. The control gate and drain are defined and located in the region of a groove formed between the stacked structures. A third polysilicon layer 40 is then deposited over the entire structure as shown in FIG. 2B. The third polysilicon layer 40 can be deposited by LPCVD (Low Pressure Chemical Vapor Deposition). Next, the third polysilicon layer 40 is anisotropically etched. The third polysilicon layer 40 is etched until it "clears" the silicon oxide layer 38 on "top" of the second polysilicon layer 34 and the sidewall structure is formed. The resulting structure is a plurality of control gates 41, which are not connected to one another. Accordingly, the control gate 41 may similar to the above-mentioned second portion 29b and act as a select transistor. Ion implantation can be performed at this point to form second doped regions 35 (drains) underneath the grooves between the sidewall control gates 41. A dielectric layer 48 is then formed over the stacked structure. The resulting structure is shown in FIG. 2D. As disclosed in U.S. Pat. No. 6,329,685, the dimension of the select transistor is defined according to the width of the sidewall control gates 41.

In summary, the above-mentioned processes can pre-define the positions for the control gate 41 and the second doped region 35. Furthermore, the control gates 41 are formed with an etching process, and the opposite control gates 41 are used as masks to define the area and position of each second doped region 35. This process, however, has the following disadvantages:

First, the complicated stacked structure as shown in FIG. 2A is formed before the deposition of the third polysilicon layer 40, so that the slopes of the sidewalls of the stacked structure may affect the thickness and uniformity of the third polysilicon layer 40. In detail, the sidewalls of the stacked structure should ideally be perfectly straight and vertical as shown in FIGS. 2A to 2D. In practice, the sidewalls of the stacked structure maybe inclined surfaces with positive or negative slopes. Thus, there are errors in the thickness and uniformity of the third polysilicon layer 40, which must be considered. Furthermore, since the third polysilicon layer 40 is etched to form the sidewall control gates 41, the error of controlling the etching process may seriously affect the width of the control gates 41 and the distance between the control gates 41. In other words, the actual shape of the stacked structure may cause errors in the thickness control of the third polysilicon layer 40 and the uniformity control of the sidewalls thereof. Therefore, combined with the errors when performing the etching process, the controllability of the dimensions of the select transistor suffers.

For this reason, it is a subjective of semiconductor memory industries to provide a method for manufacturing a memory, which can reduce the total error value while manufacturing a memory so as to increase the controllability of the dimension of the select transistor.

SUMMARY OF THE INVENTION

It is therefore an objective of the invention to provide a method for manufacturing a memory, which can reduce the total error value while manufacturing a memory.

To achieve the above-mentioned objective, a method for manufacturing a memory includes the following steps of:

1. Forming a first insulating layer on a substrate;
2. Forming a first polysilicon layer over the first insulating layer;
3. Forming a mask layer on the first polysilicon layer;
4. Etching the mask layer to expose a portion of the first polysilicon layer, and to define a first patterned region, a second patterned region and a third patterned region, wherein the third patterned region is located between the first patterned region and the second patterned region, and the exposed portion of the first polysilicon layer is located in the first patterned region and the second patterned region;
5. Etching the first polysilicon layer to remove a portion of the first polysilicon layer located in the second patterned region;
6. Implanting ions into the substrate to form a first doped region in the second patterned region;
7. Oxidizing the substrate to form a first silicon oxide region in the first patterned region, wherein the first silicon oxide region is positioned on the first polysilicon layer;
8. Stripping the mask layer;
9. Etching the first polysilicon layer with using the first silicon oxide region as a mask to form a first gate, wherein the first gate is located in the first patterned region and is positioned underneath the first silicon oxide region; and
10. Implanting ions in the substrate to form a second doped region adjacent to the first gate, wherein the first gate is located between the first doped region and the second doped region.

As mentioned above, the method for manufacturing a memory of the invention defines the floating gate region and the relative positions of the floating gate region and drain region, which can define the dimension of the select transistor, with a single photolithography process. Then, the method for manufacturing a memory of the invention utilizes self-aligned implantation to implant ions into the defined source region and drain region. Thus, the formation of the control gate does not affect the positions (and the relative positions) of the source region and drain region. Accordingly, the dimension of the select transistor would not have errors according to the error values $\Delta CD2$ and $\Delta CD3$. The inventor calls the method of the invention "pattern transferring method".

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The method for manufacturing a memory according to the preferred embodiments of the invention will be described herein below with reference to the accompanying drawings, wherein the same reference numbers refer to the same elements.

Referring to FIGS. 3A to 3M, the method for manufacturing a memory according to a preferred embodiment includes the following steps.

Figure 1A:
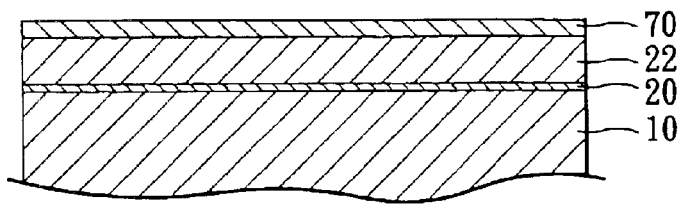
FIGS. 1A to 1J are cross-sectional side views of a memory cell showing the steps of the conventional method for manufacturing a non-volatile memory.
Figure 1B:
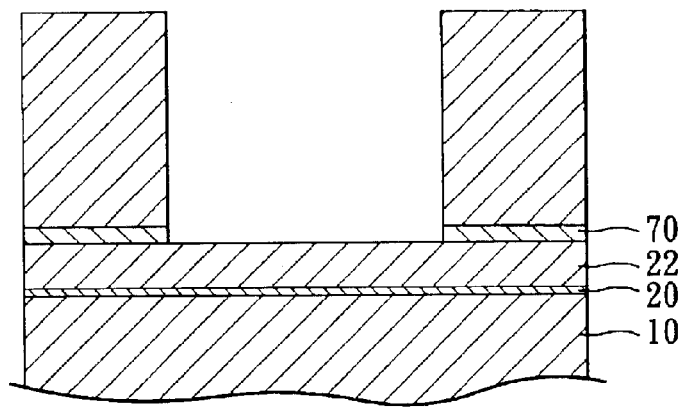
Figure 1C:
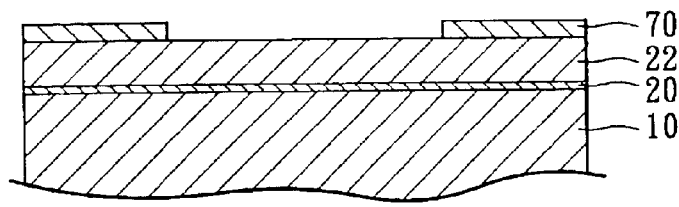
Figure 1D:
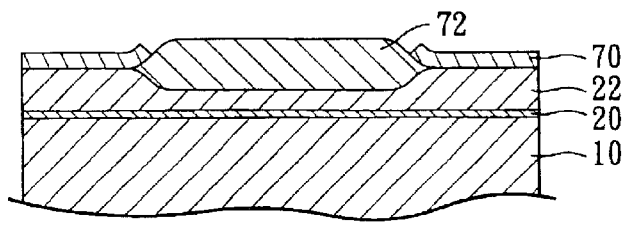
Figure 1E:
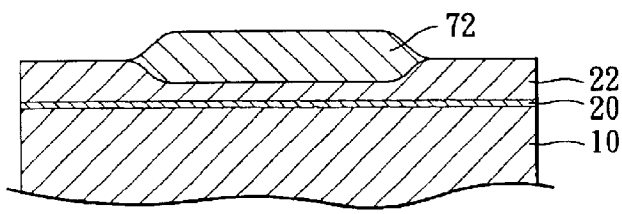
Figure 1F:
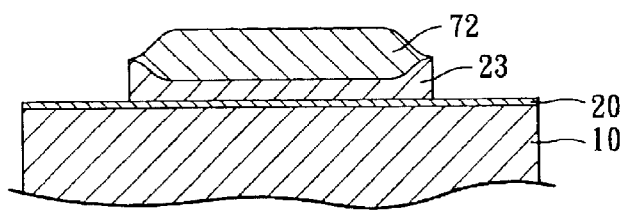
Figure 1G:
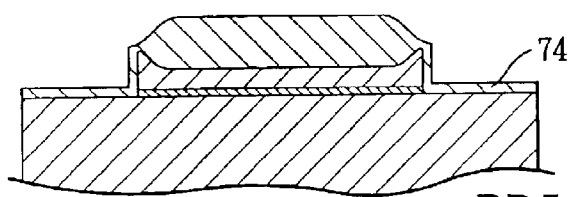
Figure 1H:
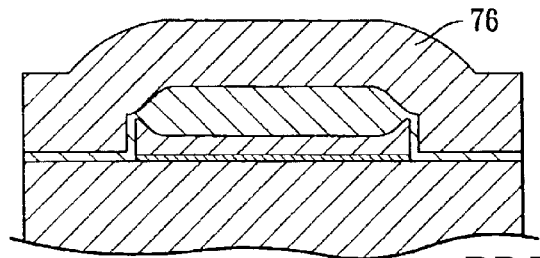
Figure 1I:
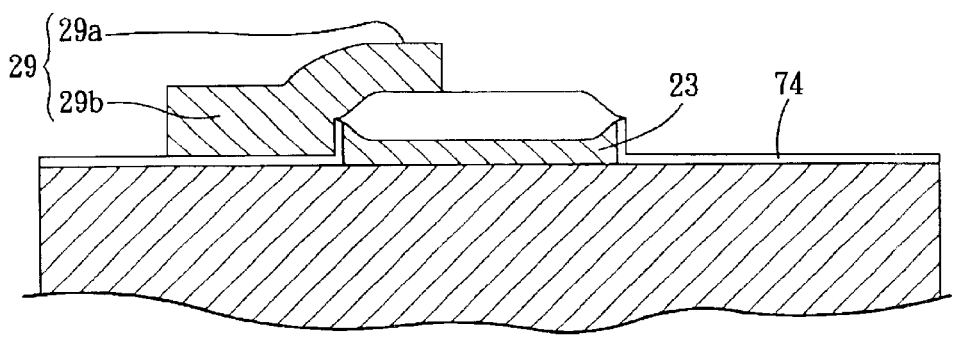
Figure 1J:
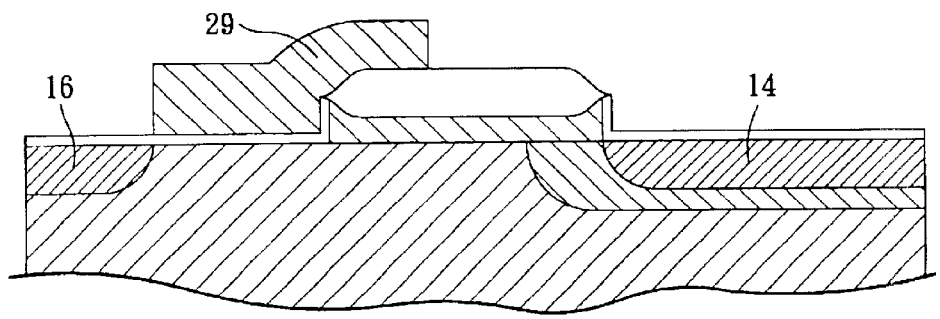
Figure 2A:
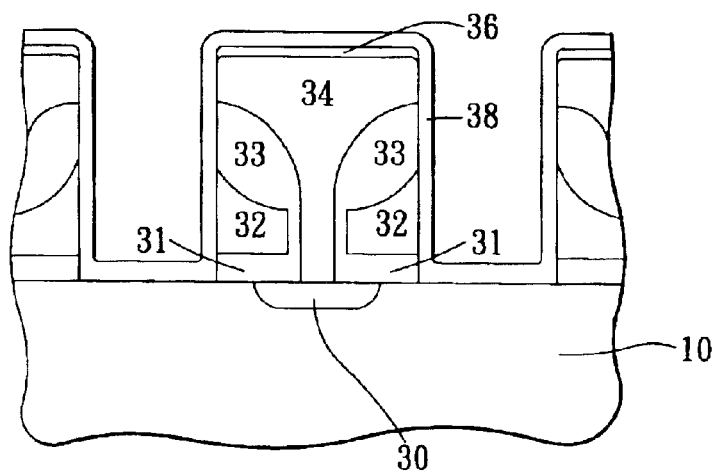
FIGS. 2A to 2D are cross-sectional side views of a memory cell showing the steps of another conventional method for manufacturing a control gate of a non-volatile memory.
Figure 2B:
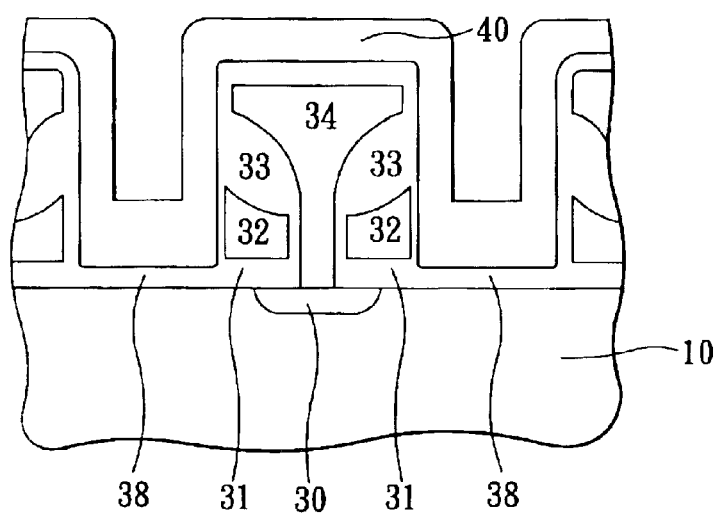
Figure 2C:
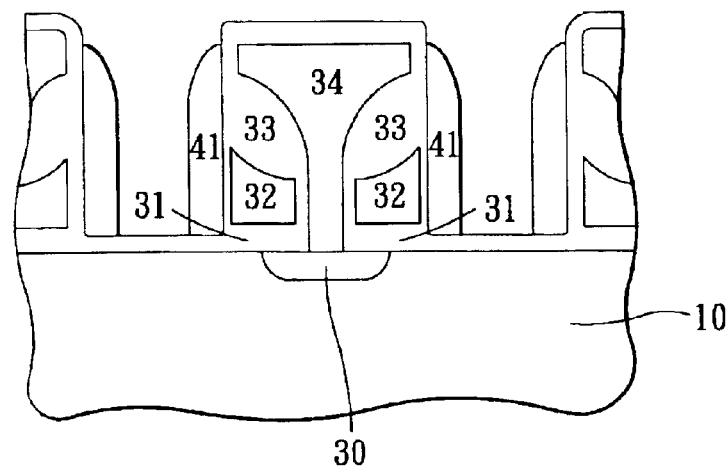
Figure 2D:
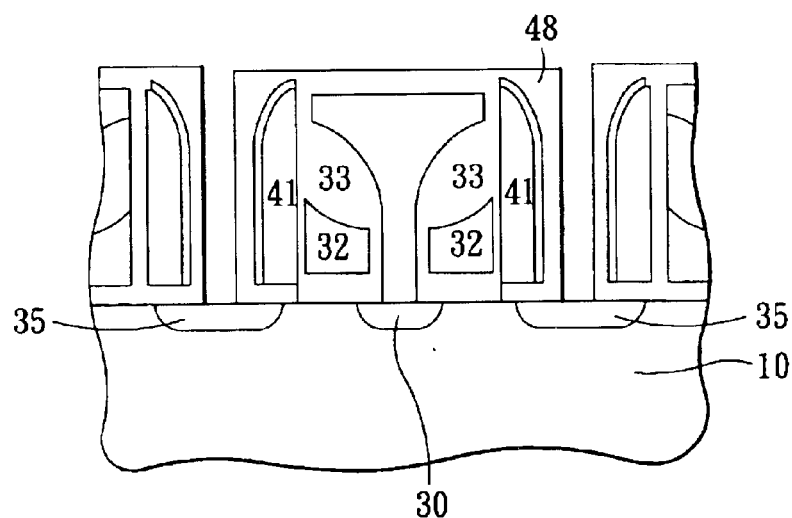
Figure 3A:
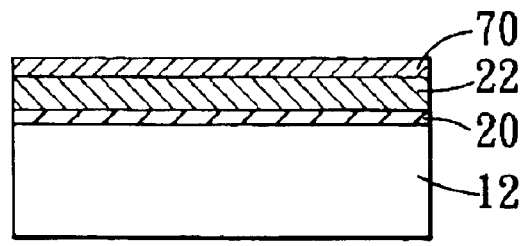
FIGS. 3A to 3M are cross-sectional side views of a memory cell showing the steps of a method for manufacturing a memory according to an embodiment of the invention.

As shown in FIG. 3A, a thermal oxidation of a substrate 10 is performed to grow a silicon oxide layer 20 (as a first insulating layer) having a thickness of 80 to 150 angstroms. Thereafter, a polysilicon layer 22 is deposited on the silicon oxide layer 20 to reach a certain thickness; e.g., 500 to 1500 angstroms. The polysilicon layer 22 is then capped with a silicon nitride layer 70 of 500 to 2000 angstroms. The polysilicon layer 22 and silicon nitride layer 70 can be deposited by conventional CVD (Chemical Vapor Deposition) processes. It should be noted that the substrate 10 includes a plurality of active areas and isolation areas (not shown) formed with a conventional STI technology. Each isolation area is provided between two sequential active areas.

Figure 3B:
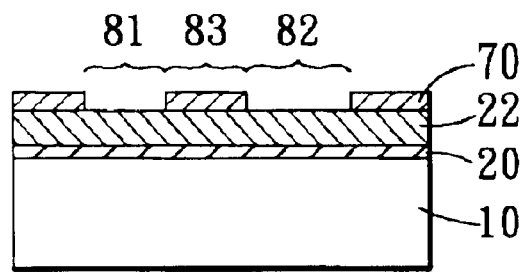

Referring to FIG. 3B, the silicon nitride layer 70 is patterned with a photolithography process to expose a portion of the polysilicon layer 22. In this step, the silicon nitride layer 70 is patterned to define a first patterned region 81, a second patterned region 82, and a third patterned region 83. The patterned silicon layer 70 is used as a mask in the subsequent processes. In the present embodiment, the third patterned region 83 is located between the first patterned region 81 and the second patterned region 82. The exposed portion of the polysilicon layer 22 is located in the first patterned region 81 and the second patterned region 82. Meanwhile, the width of the third patterned region 83 is determined according to the dimension of the select transistor, which is equal to a predetermined length.

Figure 3C:
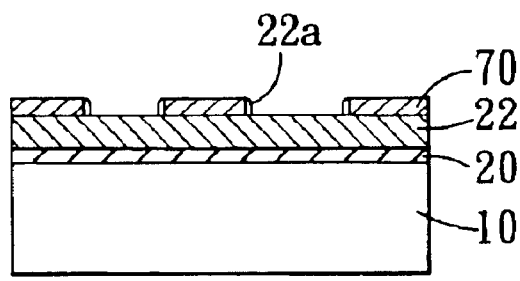
Figure 3D:
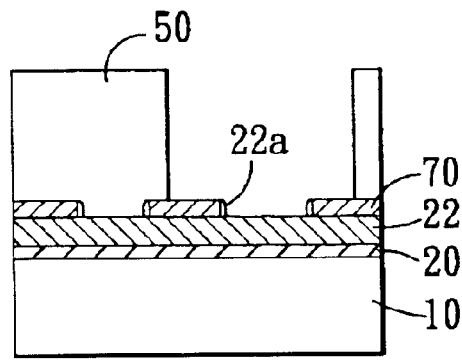

Thereafter, a plurality of spacers 22a can be formed on the sidewalls of the residual silicon nitride layer 70 (see FIG. 3C). To form the spacers, another polysilicon layer is deposited over the substrate, and is then etched back. Therefore, the spacers 22a can be defined aside the silicon nitride layer 70, which is used as a mask. In this case, a sharp curved-up charge injection region, which can increase the electron tunneling capability, can be formed using conventional deposition and etching processes.

Figure 3E:
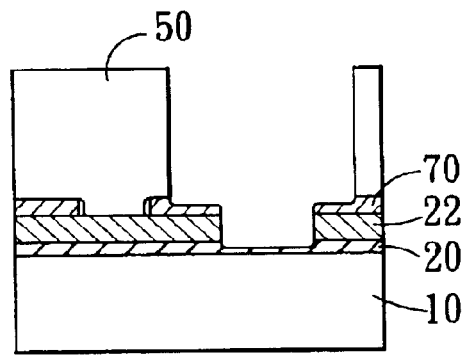

The polysilicon layer 22 located in the second patterned region 82 is then etched away. In this embodiment, a photoresist layer 50 is formed over the substrate 10, and is then patterned to expose a portion of the polysilicon layer 22 located in the second patterned region 82 and parts of the silicon nitride layer 70 adjacent to the second patterned region 82 (see FIG. 3D). Thereafter, a self-aligned etching process is performed using the photoresist layer 50 and parts the silicon nitride layer 70 as masks. As shown in FIG. 3E, the polysilicon layer 22 located in the second patterned region 82 is etched away.

Figure 3F:
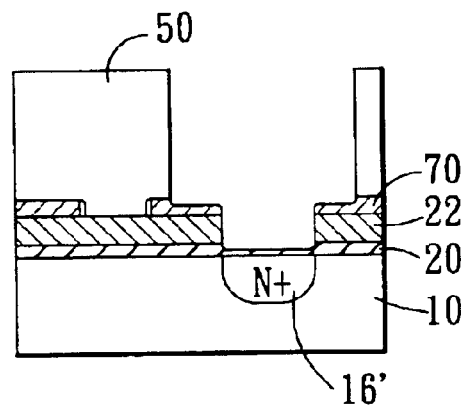

With reference to FIG. 3F, ion implantation is performed to form a first doped region 16' in the second patterned region 82. In this step, the patterned photoresist layer 50 and parts of the silicon nitride layer 70 are used as masks to perform a self-aligned ion implantation process. Ions are implanted into the exposed substrate 10, which is located in the second patterned region 82, so as to form the first doped region 16'. The first doped region 16' is the drain region 16 of the above-mentioned memory.

Figure 3G:
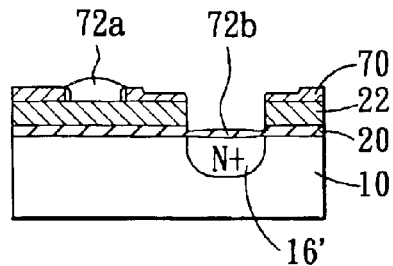

Please refer to FIG. 3G. The substrate 10 is oxidized to form a first silicon oxide region 72a in the first patterned region 81 and a second silicon oxide region 72b in the second patterned region 82. In the current embodiment, the photoresist layer 50 is first stripped away. A thermal oxidation is then performed and the silicon nitride layer 70 is used as a mask. The polysilicon layer 22 in the opening of the silicon oxide layer 70 and the exposed silicon oxide layer 20 are thermally oxidized to grow the first silicon oxide region 72a and second silicon oxide region 72b. The first silicon oxide region 72a is formed on the first polysilicon layer 22. The second silicon oxide region 72b is formed above the first-doped region 16'. In detail, the dimension and location underneath the first silicon oxide region 72a are those of the gate region of the memory, while the dimension and location underneath the second silicon oxide region 72b are those of the drain region of the memory.

Figure 3H:
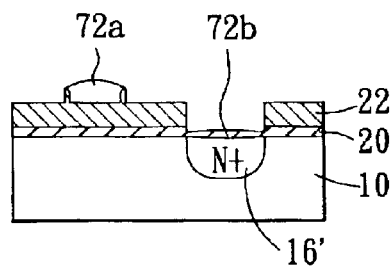

The residual silicon nitride layer 70 is then stripped away as shown in FIG. 3H. A wet etching process is performed to strip away the silicon nitride layer 70 used as a mask.

Figure 3I:
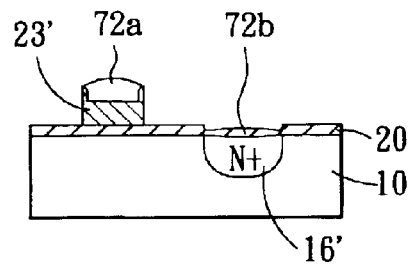
Figure 3J:
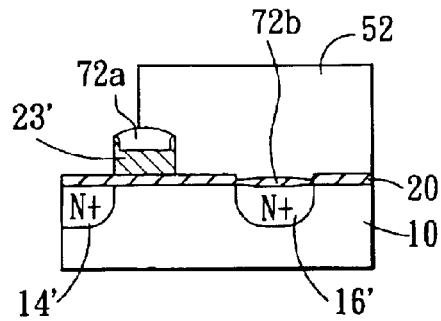
Figure 3K:
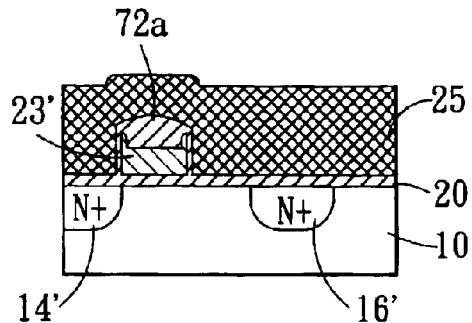
Figure 3L:
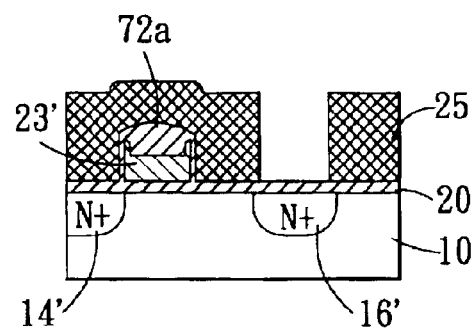
Figure 3M:
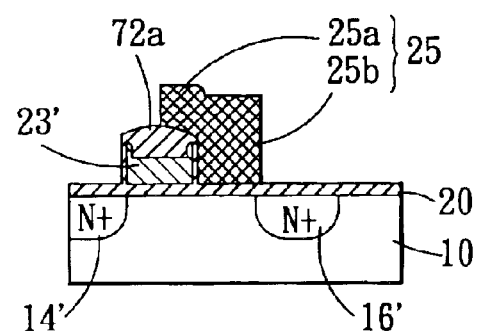

Using the first silicon oxide region 72a as a mask, the polysilicon layer 22 is etched to form a first gate 23', which is located in the first patterned region 81 underneath the first silicon oxide region 72a (see FIG. 3I). In this step, the first silicon oxide region 72a is used as a mask, and a self-aligned anisotropic etching process; e.g., a reactive ion etch, is applied to selectively etch the exposed polysilicon layer 22, which is not directly beneath the first silicon oxide region 72a. This leaves a region of polysilicon layer defined by the first silicon oxide region 72a and forms the first gate 23'. The distance between the first gate 23' and the first doped region 16' is equal to the predetermined length mentioned above. The first gate 23' of the embodiment is used as the previously mentioned floating gate 23.

Finally, ion implantation is performed, so that a second doped region 14' is formed adjacent to the first gate 23'. Accordingly, the first gate 23' is located between the first doped region 16' and the second doped region 14'. In the present embodiment, another photoresist layer 52 is spun over the substrate 10 and is patterned. The patterned photoresist layer 52 and the first silicon oxide region 72a are used as masks to perform an ion implanting process. The second doped region 14' is defined accordingly. The second doped region 14' of the embodiment is equal to the previously mentioned source region 14.

As mentioned above, the method for manufacturing a memory of the invention can accurately define the dimensions and locations of the first gate 23', first doped region 16' and second doped region 14'. Therefore, the dimension of the select transistor can be defined. In addition, the channel length between the first doped region 16' and second dope region 14' can be accurately controlled.

After the second doped region 14' is formed, the method of the invention further includes the following steps. The photoresist layer 52 is removed, and the entire structure is oxidized to form a second insulating layer. A second polysilicon layer is then deposited on the structure, and is selectively etched to form a second gate 25 over the first gate 23' (see FIG. 3K). Moreover, the second gate 25 can be further etched to expose the first doped region 16' so as to form a contact hole of the first doped region 16' (see FIG. 3L). It should be noted that the second gate 25 could be formed similar to the above-mentioned control gate 29 (see 3M). Thus, the second gate 25 includes a first portion 25a deposed over the first gate 23', and a second portion 25b, which is disposed over the silicon oxide layer 20 and is closely adjacent to the first gate 23'. The second portion 25b serves as a select transistor adjacent to the first gate 23'.

In addition, the method for manufacturing a memory of the invention may be applicable when manufacturing a memory of different structures. Thus, an additional embodiment of the invention will be described herein below.

Referring to FIGS. 4A to 4J, the method for manufacturing a memory according to an additional preferred embodiment includes the following steps.

Figure 4A:
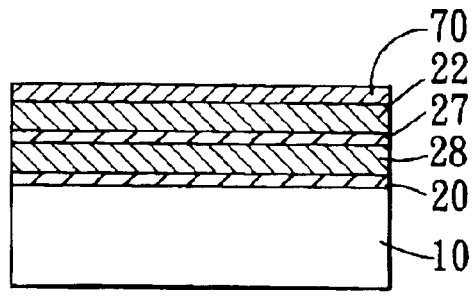
FIGS. 4A to 4J are cross-sectional side views of a memory cell showing the steps of a method for manufacturing a memory according to an additional embodiment of the invention.

As shown in FIG. 4A, a thermal oxidation of a substrate 10 is performed to grow a silicon oxide layer 20 (as a first insulating layer) having a thickness of 80 to 150 angstroms. Thereafter, a polysilicon layer 28, a dielectric layer 27, a polysilicon layer 22, and a silicon nitride layer 70 are deposited over the silicon oxide layer 20 sequentially. The layers can be deposited by conventional CVD (Chemical Vapor Deposition) processes. It should be noted that the substrate 10 includes a plurality of active areas and isolation areas (not shown) formed with a conventional STI technology. Each isolation area consists of silicon oxide and is provided between two sequential active areas. Before the polysilicon layer 28 is capped with the dielectric layer 27, an etching process is performed to pattern the polysilicon layer 28 (not shown). The polysilicon layer 28 is then defined to form the required structure of the floating gate. The dielectric layer 27 is typically a stacked insulating layer, e.g., an ONO structure.

Figure 4B:
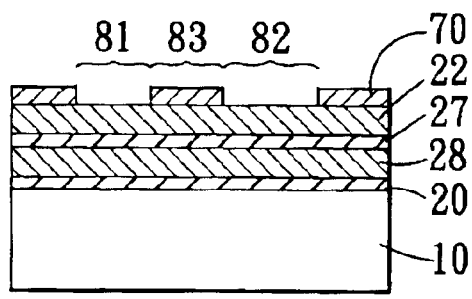
Figure 4C:
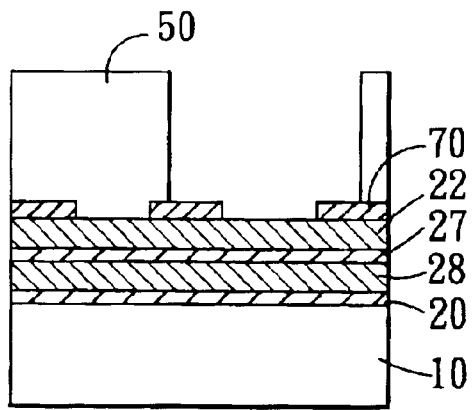

Referring to FIG. 4B, the silicon nitride layer 70 is patterned with a photolithography process to expose a portion of the polysilicon layer 22. As previously mentioned, the silicon nitride layer 70 is patterned to define a first patterned region 81, a second patterned region 82, and a third patterned region 83. The patterned silicon layer 70 is used as a mask in the subsequent processes.

Figure 4D:
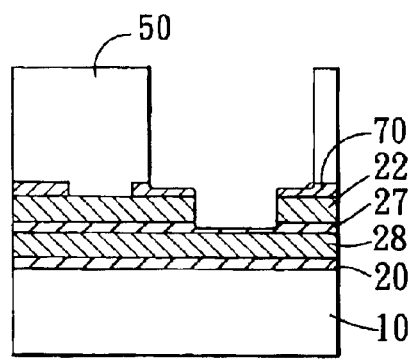

Thereafter, the polysilicon layer 22 located in the second patterned region 82 is etched away. In this embodiment, a photoresist layer 50 is formed over the substrate 10, and is then patterned to expose a portion of the polysilicon layer 22 located in the second patterned region 82 and parts of the silicon nitride layer 70 adjacent to the second patterned region 82 (see FIG. 4C). A self-aligned etching process is then performed using the photoresist layer 50 and parts of the silicon nitride layer 70 as masks. As shown in FIG. 4D, the polysilicon layer 22 located in the second patterned region 82 is etched away. Furthermore, the dielectric layer 27 and polysilicon layer 28 located in the second patterned region 82 can be etched away (not shown).

Figure 4E:
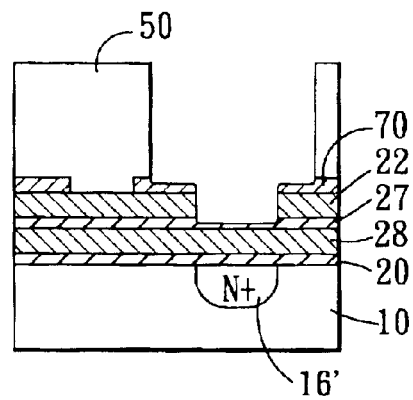
Figure 4F:
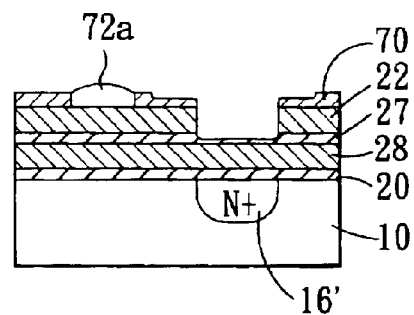

With reference to FIG. 4E, ion implantation is performed to form a first doped region 16' in the second patterned region 82. In this step, the patterned photoresist layer 50 and parts of the silicon nitride layer 70 are used as masks to perform a self-aligned ion implanting process. Ions are implanted into the exposed substrate 10, which is not covered by the photoresist layer 50 and silicon oxide layer 70, so as to form the first doped region 16'. The first doped region 16' is the drain region 16 of the above-mentioned memory. Please refer to FIG. 4F. The substrate 10 is oxidized to form a first silicon oxide region 72a in the first patterned region 81. In the current embodiment, the photoresist layer 50 is stripped away first. A thermal oxidation is then performed and the silicon nitride layer 70 is used as a mask. The polysilicon layer 22 in the opening of the silicon oxide layer 70 is thermally oxidized to grow the first silicon oxide region 72a. The first silicon oxide region 72a is formed on the first polysilicon layer 22. It should be noted that the dimension and location underneath the first silicon oxide region 72a are those of the stacked gate region of the memory.

Figure 4G:
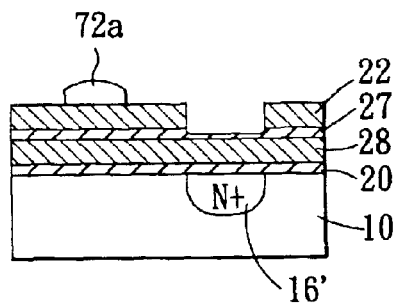
Figure 4H:
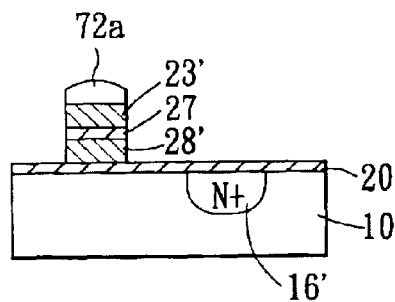
Figure 4I:
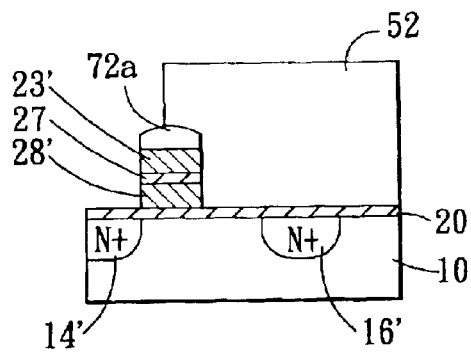
Figure 4J:
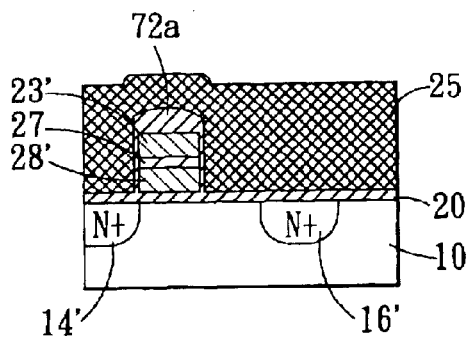

The residual silicon nitride layer 70 is then stripped away as shown in FIG. 4G. A wet etching process is performed to strip away the silicon nitride layer 70 used as a mask.

Using the first silicon oxide region 72a as a mask, the polysilicon layer 22, dielectric layer 27 and polysilicon layer 28 are etched to form a stacked gate. The stacked gate is underneath the first silicon oxide region 72a located in the first patterned region 81 and includes a first gate 23' and a third gate 28' (see FIG. 3I). In this step, the first silicon oxide region 72a is used as a mask, and a self-aligned anisotropic etching process; e.g., a reactive ion etch, is applied to selectively etch the exposed polysilicon layer 22, dielectric layer 27 and polysilicon layer 28, which are not directly located beneath the first silicon oxide region 72a. This leaves the stacked gate defined under the first silicon oxide region 72a. The stacked gate includes the first gate 23', third gate 28' and the dielectric layer 27 sandwiched between the first gate 23' and third gate 28'. The distance between the stacked gate and the first doped region 16' is equal to the predetermined length mentioned above. The third gate 28' is a floating gate, and the first gate 23' is a control gate positioned above the floating gate.

Finally, ion implantation is performed, so that a second doped region 14' is formed adjacent to the stacked gate. The stacked gate is located between the first doped region 16' and the second doped region 14'. In the present embodiment, another photoresist layer 52 is spun over the substrate 10 and is patterned. The patterned photoresist layer 52 and the first silicon oxide region 72a are used as masks to perform an ion implanting process. Accordingly, the second doped region 14' is defined. The second doped region 14' of the embodiment functions as the previously mentioned source region 14.

After the second doped region 14' is formed, this method may include the additional steps as described herein below. The photoresist layer 52 is removed, and the entire structure is oxidized to form an oxide layer. A second polysilicon layer is then deposited over the substrate, and is selectively etched to form a second gate 25 over the stacked gate (see FIG. 4J). The second gate 25 consists of a select transistor adjacent to the stacked gate. The second polysilicon layer, having a thickness of 1500 to 4000 angstroms, can be made of polysilicon or polycide. Moreover, the second gate 25 can be further etched to expose the first doped region 16' so as to form a contact hole of the first doped region 16' (not shown). It should be noted that this step is similar to the above-mentioned step referring to FIG. 3L to FIG. 3M, so that its description is simplified herein.

In summary, the method for manufacturing a memory of the invention defines the floating gate region and the relative positions of the floating gate region and drain region, which can define the dimension of the select transistor, with a single photolithography process. Then, this method utilizes a self-aligned ion implanting process to implanting ions into the defined source region and drain region. Thus, the positions (and the relative positions) of the source region and drain region can be controlled accurately. Accordingly, the dimension control of the select transistor would not include the errors of ΔCD2 (dimension error of the control gate) and ΔCD3 (misalignment between the control gate and floating gate) existed in the conventional method. The total error value while manufacturing a memory can then be reduced sufficiently, and the controllability of the select transistor can be increased, resulting in the increase of the production yield.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method for manufacturing a memory, comprising:

forming a first insulating layer on a substrate;

forming a first polysilicon layer over the first insulating layer;

forming a mask layer on the first polysilicon layer;

etching the mask layer to expose portions of the first polysilicon layer, and to define a first patterned region, a second patterned region and a third patterned region, wherein the third patterned region is located between the first patterned region and the second patterned region, the exposed portions of the first polysilicon layer locate in the first patterned region and the second patterned region, and the width of the third patterned region is equal to a predetermined length;

etching the first polysilicon layer to remove the portion of the first polysilicon layer located in the second patterned region;

implanting ions in the substrate to form a first doped region in the second patterned region;

oxidizing the substrate to form a first silicon oxide region in the first patterned region, wherein the first silicon oxide region is formed on the first polysilicon layer;

stripping the mask layer;

etching the first polysilicon layer to form a first gate with using the first silicon oxide region as a mask, wherein the first gate is located in the first patterned region and is positioned underneath the first silicon oxide region, and a distance between the first gate and the first doped region is equal to the predetermined length; and implanting ions in the substrate to form a second doped region adjacent to the first gate, wherein the first gate is located between the first doped region and the second doped region.

2. The method of claim 1, wherein the first gate is a floating gate.

3. The method of claim 2, further comprising:

oxidizing the substrate to form a second insulating layer on the first gate;

forming a second polysilicon layer on the second insulating layer; and etching the second polysilicon layer to form a second gate on the first gate.

4. The method of claim 3, wherein the second gate has a first portion located over the first gate, and a second portion disposed over the second insulating layer and adjacent to the first gate, and the second portion forms a select transistor adjacent to the first gate.

5. The method of claim 1, further comprising:

forming a plurality of spacers on sidewalls of the residual mask layer after the step of etching the mask layer to expose the portion of the first polysilicon layer.

6. The method of claim 1, wherein a photoresist layer and the mask layer are utilized to perform a self-aligned etching process in the step of etching the first polysilicon layer in the second patterned region.

7. The method of claim 6, wherein the photoresist layer and the mask layer are utilized to perform a self-aligned implanting process in the step of implanting ions in the substrate to form the first doped region in the second patterned region.

8. The method of claim 1, wherein the second doped region is a source, and the first doped region is a drain.

9. The method of claim 1, further comprising:

forming a third polysilicon layer on the first insulating layer; and forming a third insulating layer on the third polysilicon layer, wherein the first polysilicon layer is formed over the third insulating layer.

10. The method of claim 9, wherein the step of etching the first polysilicon layer in the second patterned region further comprises:

etching the third insulating layer and the third polysilicon layer in the second patterned region.

11. The method of claim 9, wherein the step of etching the first polysilicon layer with using the first silicon oxide region as the mask to form the first gate further comprises:

etching the third insulating layer with using the first silicon oxide region as a mask; and etching the third polysilicon layer to form a third gate with using the first silicon oxide region as a mask.

12. The method of claim 11, wherein the third gate is a floating gate, and the first gate is a control gate.

13. The method of claim 11, further comprising:

oxidizing the substrate to form a second insulating layer over the substrate;

forming a second polysilicon layer on the second insulating layer; and etching the second polysilicon layer to form a second gate.

14. The method of claim 13, wherein the second gate is positioned over the first gate and extends at least to a side of the third gate, and the second gate forms a select transistor immediately adjacent to the first gate and the third gate.

15. The method of claim 9, wherein the third insulating layer is an ONO structure insulator.

* * * * *